(12) United States Patent
Broyde et al.

(10) Patent No.: US 9,621,132 B2
(45) Date of Patent: Apr. 11, 2017

(54) ANTENNA TUNING APPARATUS FOR A MULTIPORT ANTENNA ARRAY

(71) Applicant: Samsung Electronics Co., Ltd., Suwon-si, Gyeonggi-do (KR)

(72) Inventors: Frédéric Broyde, Maule (FR); Evelyne Clavelier, Maule (FR)

(73) Assignee: Samsung Electronics Co., Ltd., Suwon-si (KR)

(*) Notice: Subject to any disclaimer, the term of this patent is extended or adjusted under 35 U.S.C. 154(b) by 282 days.

(21) Appl. No.: 14/314,148

(22) Filed: Jun. 25, 2014

(65) Prior Publication Data

US 2014/0306784 A1 Oct. 16, 2014

Related U.S. Application Data

(63) Continuation of application No. PCT/IB2013/058423, filed on Sep. 10, 2013.

(30) Foreign Application Priority Data

Sep. 25, 2012 (FR) ..................... 12 02542

(51) Int. Cl.
*H03J 1/06* (2006.01)
*H03H 7/01* (2006.01)
(Continued)

(52) U.S. Cl.
CPC ............... *H03J 1/06* (2013.01); *H01Q 1/241* (2013.01); *H01Q 21/0006* (2013.01);
(Continued)

(58) Field of Classification Search
CPC ......... H03J 1/06; H04B 17/12; H04B 1/0458; H04B 1/18; H01Q 1/241; H01Q 21/0006; H03H 7/1741; H03H 7/40
(Continued)

(56) References Cited

U.S. PATENT DOCUMENTS 6,907,234 B2 6/2005 Karr et al.
8,059,058 B2 11/2011 Lau et al.
(Continued)

FOREIGN PATENT DOCUMENTS

EP 0 367 555 A2 5/1990
EP 1 542 311 A1 6/2005
(Continued)

OTHER PUBLICATIONS

Weber J. et al., Miniaturized antenna arrays using decoupling networks with realistic elements, IEEE Transactions on Microwave Theory and Techniques, Jun. 1, 2006, vol. 54, No. 6, XP001545079, IEEE Service Center, Piscataway, NJ, USA.
(Continued)

*Primary Examiner* — Stephen E Jones
*Assistant Examiner* — Scott S Outten
(74) *Attorney, Agent, or Firm* — Jefferson IP Law, LLP

(57) ABSTRACT

An antenna tuning apparatus for a multiport antenna array used for sending and/or receiving electromagnetic waves for radio communication comprises: 4 antenna ports, 4 user ports, 10 adjustable impedance devices each presenting a negative reactance and having a terminal coupled to one of the antenna ports, 4 windings each having a first terminal coupled to one of the antenna ports and a second terminal coupled to one of the user ports, and 10 adjustable impedance devices each presenting a negative reactance and having a terminal coupled to one of the user ports. All adjustable impedance devices are adjustable by electrical means. Any small variation in the impedance matrix of the antenna array, caused by a change in operating frequency or a change in the medium surrounding the antennas, can be compensated with a new adjustment of the adjustable impedance devices.

15 Claims, 7 Drawing Sheets

(51) Int. Cl.
| | |
|---|---|
| H03H 7/40 | (2006.01) |
| H04B 1/04 | (2006.01) |
| H04B 1/18 | (2006.01) |
| H01Q 1/24 | (2006.01) |
| H01Q 21/00 | (2006.01) |
| H04B 17/12 | (2015.01) |

(52) U.S. Cl.
CPC ............ *H03H 7/1741* (2013.01); *H03H 7/40* (2013.01); *H04B 1/0458* (2013.01); *H04B 1/18* (2013.01); *H04B 17/12* (2015.01)

(58) Field of Classification Search
USPC .......................................................... 333/124
See application file for complete search history.

(56) References Cited

U.S. PATENT DOCUMENTS

| | | | |
|---|---|---|---|
| 8,253,645 | B2 | 8/2012 | Derneryd et al. |
| 2009/0121961 | A1 | 5/2009 | Sangawa |
| 2013/0194139 | A1 | 8/2013 | Nickel et al. |
| 2014/0364077 | A1* | 12/2014 | Maxim ................ H03H 7/0115 455/296 |

FOREIGN PATENT DOCUMENTS

| | | |
|---|---|---|
| EP | 1 939 980 A1 | 7/2008 |
| WO | 2008/010035 A1 | 1/2008 |
| WO | WO2008/010035 A1 | 1/2008 |
| WO | WO2008/030165 A1 | 3/2008 |

OTHER PUBLICATIONS

Chaloupka H. J. et al., Novel approach for diversity and MIMO antennas at small mobile platforms, Indoor and Mobile Radio Communications, Sep. 5, 2004, vol. 1, p. 637-642, XP010754626, IEEE, Piscataway, NJ, USA.

Krewski et al, "Matching Network Synthesis for Mobile MIMO Antennas Based on Minimization of the Total Multi-Port Reflectance", Proc. of the 2011 Loughborough Antenna and Propagation Conference, LAPC 2011, pp. 1-4, Nov. 14-15, 2011.

Krewski et al, "Electrically Tunable Mode Decomposition Network for 2-port MIMO Antennas", Proc. of the 2013 Loughborough Antennas and Propagation Conference (LAPC), pp. 553-558, Nov. 11-12, 2013.

Broyde et al, "Some Properties of Multiple-Antenna-Port and Multiple-User-Port Antenna Tuners", IEEE Trans. on Circuits and Systems—I: Regular Papers, vol. 62, No. 2, pp. 423-432, Feb. 2015.

Broyde et al, "Two Multiple-Antenna-Port and Multiple-User-Port Antenna Tuners", Proc. 9th European Conference on Antenna and Propagation, EuCAP 2015, Apr. 2015.

F. Chan Wai Po et al., "A Novel Method for Synthesizing an Automatic Matching Network and Its Control Unit", IEEE Transactions on Circuits and Systems—I: Regular Papers, vol. 58, No. 9, pp. 2225-2236, Sep. 2011.

Q. Gu et al., "An Analytical Algorithm for Pi-Network Impedance Tuners", IEEE Transactions on Circuits and Systems—I: Regular Papers, vol. 58, No. 12, pp. 2894-2905, Dec. 2011.

K.R. Boyle et al., "A Self-Contained Adaptive Antenna Tuner for Mobile Phones", Proceedings of the 6th European Conference on Antenna and Propagation (EUCAP), pp. 1804-1808, Mar. 2012.

"Dictionnaire CEI multilingue de l'électricité —IEC multilingual dictionary of electricity", published by the "Bureau Central de la Commission Electrotechnique Internationale", 1983.

S.M. Ali et al., "Controlling Coupling Between Two Transmitting Antennas for MIMO Handset Applications, Proceedings of the 2011 IEEE 22nd International Symposium on Personal, Indoor and Mobile Radio Communications", pp. 2060-2064, 2011.

J. Weber et al., "Miniaturized Antenna Arrays Using Decoupling Networks With Realistic Elements", IEEE Transactions on Microwave Theory and Techniques, vol. 54, No. 6, pp. 2733-2740, Jun. 2006.

Search report for French Patent Application No. 12/02542, dated Jul. 5, 2013.

P.S. Taluja et al., "Fundamental Capacity Limits on Compact MIMO-OFDM Systems", Proceedings of the 2012 IEEE International Conference on Communications (ICC), pp. 2547-2552, 2012.

\* cited by examiner

ANTENNA TUNING APPARATUS FOR A MULTIPORT ANTENNA ARRAY

CROSS REFERENCE TO RELATED APPLICATIONS

This is a Continuation Application of PCT application No. PCT/IB2013/058423, filed 10 Sep. 2013, published in English under No. WO 2014/049475, which in turn claims priority to French patent application No. 12/02542 filed 25 Sep. 2012 and entitled "Appareil d'accord d'antenne pour un réseau d'antennes à accès multiple", both of which are incorporated herein by reference.

FIELD OF THE INVENTION

The invention relates to an antenna tuning apparatus for a multiport antenna array, the multiport antenna array being used for sending and/or receiving electromagnetic waves for radio communication. The radio communication may carry information of any nature, for instance signals for speech transmission and/or image transmission (television) and/or data transmission. The radio communication may use any type of operation, for instance broadcasting, bidirectional point-to-point radio communication or radio communication in a cellular network.

PRIOR ART

An antenna tuning apparatus, also often referred to as antenna tuner, is a passive apparatus intended to be inserted between an active equipment for radio communication, for instance a radio transmitter or a radio receiver, and its antenna to obtain that the impedance seen by the active equipment for radio communication matches a target value.

The FIG. 1 shows a block diagram of a typical use of an antenna tuning apparatus (31) for tuning a single antenna (11), the antenna operating (or being used) in a given frequency band. The antenna tuning apparatus (31) comprises:
- an antenna port (311), the antenna port being coupled to the antenna (11) through a feeder (21), the antenna port (311) seeing, at a frequency in said given frequency band, an impedance referred to as the impedance seen by the antenna port;
- a user port (312), the user port being coupled to the user (5) through an interconnection (41), the user port (312) presenting, at said frequency in said given frequency band, an impedance referred to as the impedance presented by the user port;
- one or more adjustable impedance devices, each of the adjustable impedance devices having a reactance at said frequency in said given frequency band, the reactance of any one of the adjustable impedance devices being adjustable and having an influence on the impedance presented by the user port.

The user (5) is an active equipment for radio communication such as a transmitter, a receiver or a transceiver. The feeder (21) may for instance be a coaxial cable. In some cases, when the antenna tuning apparatus (31) is placed close to the antenna (11), the feeder (21) is not present. The interconnection (41) may for instance be a coaxial cable. In some cases, when the antenna tuning apparatus (31) is placed close to the user (5), the interconnection (41) is not present.

An adjustable impedance device is a component comprising two terminals which substantially behave as a passive linear two-terminal circuit element, and which are consequently fully characterized by an impedance which may depend on frequency, this impedance being adjustable. An adjustable impedance device may be adjustable by mechanical means, for instance a variable resistor, a variable capacitor, a network comprising a plurality of capacitors and one or more switches or change-over switches used to cause different capacitors of the network to contribute to the reactance, a variable inductor, a network comprising a plurality of inductors and one or more switches or change-over switches used to cause different inductors of the network to contribute to the reactance, or a network comprising a plurality of open-circuited or short-circuited stubs and one or more switches or change-over switches used to cause different stubs of the network to contribute to the reactance. We note that all examples in this list, except the variable resistor, are intended to provide an adjustable reactance.

An antenna tuning apparatus behaves, at any frequency in the given frequency band, with respect to the antenna port and the user port, substantially as a passive linear 2-port device. Here "passive" is used in the meaning of circuit theory, so that the antenna tuning apparatus does not provide amplification. In practice, losses are undesirable for signals applied to the antenna port or the user port of an antenna tuning apparatus, in the given frequency band. Thus, an ideal antenna tuning apparatus is lossless for signals applied to its antenna port or user port, in the given frequency band.

A specialist understands that the impedance presented by the user port may be considered as an element of a real vector space of dimension 2, and that a mapping may be defined for a given impedance seen by the antenna port, the mapping associating the impedance presented by the user port to said reactances, the mapping having, at a given value of each of the reactances, a partial derivative with respect to each of the reactances, a span of the partial derivatives being defined in the real vector space, the span being of dimension 0 or 1 or 2.

A specialist understands that, if the span is of dimension 2, the system shown in FIG. 1 can be used to obtain the best possible performance from the antenna, in particular when the frequency of operation is varied, or when the electromagnetic characteristics of the volume surrounding the antenna are varied, for instance a movement of the hand of the user of a portable phone. Conversely, if the span is of dimension 1, the possibilities of the system shown in FIG. 1 are more limited. A specialist understands that at least two adjustable impedance devices are required to obtain a span of dimension 2. A specialist also understands that two or more adjustable impedance devices do not automatically lead to a span of dimension 2.

The FIG. 2 shows a schematic diagram of an antenna tuning apparatus (31) which could be used as shown in FIG. 1 to tune a single antenna, the antenna being used in a given frequency band. The antenna tuning apparatus shown in FIG. 2 comprises:
- an antenna port (311) having two terminals (3111) (3112), the antenna port being single-ended;
- a user port (312) having two terminals (3121) (3122), the user port being single-ended, the user port presenting, at a frequency in said given frequency band, an impedance referred to as the impedance presented by the user port;
- a coil (315);
- two adjustable impedance devices (313) (314), each of the adjustable impedance devices being a variable capacitor having a reactance at said frequency in said given frequency band, the reactance of any one of the adjustable impedance devices having an influence on the impedance presented by the user port.

An antenna tuning apparatus of the type shown in FIG. 2 is for instance used in the article of F. Chan Wai Po, E. de Foucault, D. Morche, P. Vincent and E. Kerhervé entitled "A Novel Method for Synthesizing an Automatic Matching Network and Its Control Unit", published in *IEEE Transactions on Circuits and Systems—I: Regular Papers*, vol. 58, No. 9, pp. 2225-2236 in September 2011. The article of Q. Gu, J. R. De Luis, A. S. Morris, and J. Hilbert entitled "An Analytical Algorithm for Pi-Network Impedance Tuners", published in *IEEE Transactions on Circuits and Systems—I: Regular Papers*, vol. 58, No. 12, pp. 2894-2905 in December 2011, and the article of K. R. Boyle, E. Spits, M. A. de Jongh, S. Sato, T. Bakker and A. van Bezooijen entitled "A Self-Contained Adaptive Antenna Tuner for Mobile Phones", published in the *Proceedings of the 6th European Conference on Antenna and Propagation (EUCAP)*, pp. 1804-1808 in March 2012, consider an antenna tuning apparatus of a type similar to the one shown in FIG. 2, the main difference being that the coil (315) of FIG. 2 is replaced with an adjustable impedance device, the adjustable impedance device being a variable inductor or an inductor connected in parallel with a variable capacitor.

The FIG. 3 shows a schematic diagram of another antenna tuning apparatus (31) which could be used as shown in FIG. 1 to tune a single antenna, the antenna operating in a given frequency band. The antenna tuning apparatus shown in FIG. 3 comprises:

an antenna port (311) having two terminals (3111) (3112), the antenna port being symmetrical (i.e., balanced);

a user port (312) having two terminals (3121) (3122), the user port being single-ended, the user port presenting, at a frequency in said given frequency band, an impedance referred to as the impedance presented by the user port;

a transformer (316) and a coil (319);

two adjustable impedance devices (317) (318), each of the adjustable impedance devices being a variable capacitor having a reactance at said frequency in said given frequency band, the reactance of any one of the adjustable impedance devices having an influence on the impedance presented by the user port.

A specialist knows that the antenna tuning apparatuses shown in FIG. 2 and in FIG. 3 are commonly used to obtain a span of dimension 2. Conversely, the antenna tuning apparatus disclosed in the patent of the U.S. Pat. No. 6,907,234, entitled "System and Method for Automatically Tuning an Antenna", delivered in June 2005 (inventors Karr et al.) can only provide a span of dimension 1.

Some receivers and transmitters for radio communication use a plurality of antennas simultaneously, in the same frequency band. Such receivers and transmitters are for instance used in MIMO radio communication. For such applications, it is possible to use a plurality of antenna tuning apparatuses, each of the antenna tuning apparatuses having a single antenna port and a single user port, like the antenna tuning apparatuses shown in FIG. 2 and FIG. 3.

The FIG. 4 shows a block diagram of a typical use of a plurality of independent antenna tuning apparatuses (31) (32) (33) (34) for simultaneously tuning 4 antennas (11) (12) (13) (14), the 4 antennas operating in a given frequency band, the 4 antennas forming an antenna array (1). In FIG. 4, each of the antenna tuning apparatuses (31) (32) (33) (34) comprises:

an antenna port (311) (321) (331) (341), the antenna port being coupled to one of the antennas (11) (12) (13) (14) through a feeder (21) (22) (23) (24);

a user port (312) (322) (332) (342), the user port being coupled to the user (5) through an interconnection (41) (42) (43) (44);

one or more adjustable impedance devices each having a reactance at a given frequency, the reactance of any one of the adjustable impedance devices being adjustable.

An "antenna system" disclosed in the international application number PCT/SE2007/000776 (WO2008/030165) and in the patent of the U.S. Pat. No. 8,059,058, both entitled "Antenna system and method for operating an antenna system" and both invented by B. K. Lau and J. Bach Andersen, is primarily defined as comprising N antennas, where N is an integer greater than or equal to 2, and an "impedance matching network", the "impedance matching network" having N input ports and N output ports, the "impedance matching network" being characterized in that it is adaptive.

According to the "Dictionnaire CEI multilingue de l'électricité—IEC multilingual dictionary of electricity" published by the "Bureau Central de la Commission Electrotechnique Internationale" in 1983, the meaning of "adaptive" in electronics is: "whose characteristics are time-variable and result from the optimization of some operational conditions or process". It is important to note that said international application number PCT/SE2007/000776 and patent of the U.S. Pat. No. 8,059,058 use the word "adaptive" with two different meanings: the meaning indicated above, and another meaning which seems to be synonymous with "controllable". We are interested in the case where the "impedance matching network" is controlled as a function of a control signal based on at least one channel parameter of the signals received by the antennas.

At a given frequency, an electronic circuit "A" comprising a port having a linear characteristic may be such that this port presents any impedance, that is to say an impedance taking on any value in the set of complex numbers. However, the specialist understands that if the electronic circuit "A" is passive in the meaning of circuit theory, said impedance is such that its real part is positive or zero. In a similar way, an electronic circuit "B" comprising N ports having linear characteristics may be such that these ports present any impedance matrix, that is to say an impedance matrix, denoted by Z, taking on any value in the set of N by N complex matrices. However, the specialist understands that if the electronic circuit "B" is passive in the meaning of circuit theory, said impedance matrix is such that $Z+Z^*$ is an hermitian matrix whose eigenvalues are positive or zero, where $Z^*$ is the hermitian adjoint of Z. Said international application number PCT/SE2007/000776 and patent of the U.S. Pat. No. 8,059,058 indicate a desirable property of the "impedance matching network": being "arranged to realize any N by N impedance matrix, as seen from the antenna ports", to obtain a "full implementation of the antenna system". The specialist understands that some of these impedance matrices imply that, when the antennas are used for radio reception, the antennas receive radio-frequency power from the "impedance matching network". Of course, any one of said some of these impedance matrices, denoted by Z, is such that $Z+Z^*$ is an hermitian matrix having one or more strictly negative eigenvalues. The prior art, however, does not teach how to build an "impedance matching network" having this property, and said international application number PCT/SE2007/000776 and patent of the U.S.

Pat. No. 8,059,058 provide no indication on the type of circuit which can be used to realize the "impedance matching network".

Said international application number PCT/SE2007/000776 and patent of the U.S. Pat. No. 8,059,058 also describe an "antenna system" using an "impedance matching network" for N=2, such that the antennas see the "impedance matching network" as an impedance $Z_L$ connected to each antenna. In this case, the impedance matrix presented by the "impedance matching network" to the antennas is a diagonal matrix equal to $Z_L I_2$ where $I_2$ is the identity matrix of size 2×2, and the "impedance matching network" could obviously consist of 2 antenna tuning apparatuses, each of the antenna tuning apparatuses having a single antenna port and a single user port, as discussed above.

An article of S. M. Ali and J. Warden entitled "Controlling Coupling Between Two Transmitting Antennas for MIMO Handset Applications", published in the proceedings of the "2011 *IEEE 22nd International Symposium on Personal, Indoor and Mobile Radio Communications*", pages 2060 to 2064, in 2011, discloses a "connection circuit" comprising two antenna ports, two user ports, and 5 or 6 "sections", each "section" having two ports and consisting of transmission lines and/or capacitive and/or inductive lumped components. The article of S. M. Ali and J. Warden says that:
  the function of two of said "sections" (referred to as sections S1 and S3 in said article) is to obtain that each of the two antennas is matched to its driving point impedance;
  the function of one or two of said "sections" (referred to as sections S4 and S2 in said article) is to "control the back scattering currents at each of the antenna ports";
  the function of two of said "sections" (referred to as sections S5 and S6 in said article) is to obtain maximum power transfer from the "radio I/O" to the "connection circuit".

A difficulty in the approach used in said article of S. M. Ali and J. Warden is related to the fact that it often refers to the concept of driving point impedance to define some matching requirements. Said "Dictionnaire CEI multilingue de l'électricité—IEC multilingual dictionary of electricity" defines the "driving point immittance of an n-port network" as the immittance seen at the port at which the signal is applied, and notes that its value is a function of terminating immittances at the other ports. This note about terminating immittances applies to the case where each of the other ports is connected to a linear one-port, but the situation is more complex in the case where the other ports are connected to n−1 ports of a more general circuit. In this case, we can only say that the value of the driving point immittance is a function of what is connected to the other ports. Consequently, the requirement that the "sections" S1 and S3 be such that each of the two antennas is matched to its driving point impedance is involved because the presence of each of the "sections" modifies both what is seen by one antenna and its driving point impedance (because what is connected to the other antenna is also modified). In fact, the prior art does not teach that this requirement can be satisfied. Thus, the specialist does not know if it is possible to design S1 and S3 such that they can perform their assigned function.

Said article of S. M. Ali and J. Warden indicates that the "sections" of the "connection circuit" could be made tunable, but does not provide the schematic diagram of a possible embodiment. Consequently, a specialist does not know how to build a "connection circuit" and what the limitations are. However, if we assume that it is possible to design and proportion a "connection circuit" performing as claimed in said article of S. M. Ali and J. Warden, and that the tuning of each "section" provides two tunable real parameters (since two real parameters are necessary to fully adjust a complex impedance), we note that this circuit uses 10 or 12 adjustable parameters. In said article of S. M. Ali and J. Warden, it is also explained that 6 "sections" are necessary to compensate any small variation in the impedance matrix of the two antennas, so that 12 adjustable parameters are necessary to obtain this wanted result, if it can be obtained.

Also, the "connection circuit" disclosed in said article of S. M. Ali and J. Warden has only two antenna ports, and it cannot be extended or generalized to a "connection circuit" having more than two antenna ports.

The use of a plurality of single-input-port and single-output-port antenna tuners, shown in FIG. 4, is appropriate for simultaneously tuning a plurality of antennas, if the interactions between the antennas can be neglected. However, it can be shown that this use usually does not provide the best possible performance in the cases where the interactions between the antennas cannot be neglected. The main reason of this limitation is that the plurality of independent antenna tuning apparatuses cannot usually be used in such a way that the impedance matrix presented by the user ports is a wanted diagonal impedance matrix, the wanted diagonal impedance matrix being in most cases a real diagonal matrix.

SUMMARY OF THE INVENTION

The purpose of the invention is a passive apparatus for simultaneously tuning a plurality of antennas, which does not have the above-mentioned limitations of known techniques.

The invention is an apparatus for tuning n antennas, where n is an integer greater than or equal to 2, the n antennas operating (or being used) in a given frequency band, the apparatus comprising:
  n antenna ports, the antenna ports seeing, at a frequency in said given frequency band, an impedance matrix referred to as "the impedance matrix seen by the antenna ports", the impedance matrix seen by the antenna ports being a complex matrix of size n×n;
  m user ports, where m is an integer greater than or equal to 2, the user ports presenting, at said frequency in said given frequency band, an impedance matrix referred to as "the impedance matrix presented by the user ports", the impedance matrix presented by the user ports being a complex matrix of size m×m;
  p adjustable impedance devices, where p is an integer greater than or equal to 2m, each of the adjustable impedance devices having a reactance at said frequency in said given frequency band, the reactance of any one of the adjustable impedance devices having, if the impedance matrix seen by the antenna ports is equal to a given diagonal impedance matrix, an influence on the impedance matrix presented by the user ports, the reactance of at least one of the adjustable impedance devices having, if the impedance matrix seen by the antenna ports is equal to the given diagonal impedance matrix, an influence on at least one non-diagonal entry of the impedance matrix presented by the user ports, the reactance of any one of the adjustable impedance devices being adjustable by electrical means.

It is assumed that said apparatus for tuning n antennas behaves, at any frequency in the given frequency band, with respect to its antenna ports and user ports, substantially as a passive linear device, like the prior art antenna tuning apparatuses presented above in the prior art section. More precisely, said apparatus for tuning n antennas behaves, at any frequency in the given frequency band, with respect to the n antenna ports and the m user ports, substantially as a passive linear (n+m)-port device. As a consequence of linearity, it is possible to define "the impedance matrix presented by the user ports". As a consequence of passivity, the antenna tuning apparatus does not provide amplification.

An adjustable impedance device having a reactance which is adjustable by electrical means may be such that it only provides, at said frequency in said given frequency band, a finite set of reactance values, this characteristic being for instance obtained if the adjustable impedance device is:

a network comprising a plurality of capacitors or open-circuited stubs and one or more electrically controlled switches or change-over switches, such as electromechanical relays, or microelectromechanical switches (MEMS switches), or PIN diodes or insulated-gate field-effect transistors (MOSFETs), used to cause different capacitors or open-circuited stubs of the network to contribute to the reactance; or a network comprising a plurality of coils or short-circuited stubs and one or more electrically controlled switches or change-over switches used to cause different coils or short-circuited stubs of the network to contribute to the reactance.

An adjustable impedance device having a reactance which is adjustable by electrical means may be such that it provides, at said frequency in said given frequency band, a continuous set of reactance values, this characteristic being for instance obtained if the adjustable impedance device is based on the use of a variable capacitance diode; or a MOS varactor; or a microelectromechanical varactor (MEMS varactor); or a ferroelectric varactor.

According to the invention, it is required that: the apparatus for tuning n antennas comprises p adjustable impedance devices, where p is an integer greater than or equal to 2m, each of the adjustable impedance devices having a reactance at said frequency in said given frequency band, the reactance of any one of the adjustable impedance devices having, if the impedance matrix seen by the antenna ports is equal to a given diagonal impedance matrix, an influence on the impedance matrix presented by the user ports, the reactance of at least one of the adjustable impedance devices having, if the impedance matrix seen by the antenna ports is equal to the given diagonal impedance matrix, an influence on at least one non-diagonal entry of the impedance matrix presented by the user ports, the reactance of any one of the adjustable impedance devices being adjustable by electrical means. This must be interpreted as meaning: the apparatus for tuning n antennas comprises p adjustable impedance devices, where p is an integer greater than or equal to 2m, each of the adjustable impedance devices having a reactance at said frequency in said given frequency band, the reactance of any one of the adjustable impedance devices being adjustable by electrical means, the apparatus for tuning n antennas being such that there exists a diagonal impedance matrix referred to as the given diagonal impedance matrix, the given diagonal impedance matrix being such that, if the impedance matrix seen by the antenna ports is equal to the given diagonal impedance matrix, then (a) the reactance of any one of the adjustable impedance devices has an influence on the impedance matrix presented by the user ports, and (b) the reactance of at least one of the adjustable impedance devices has an influence on at least one non-diagonal entry of the impedance matrix presented by the user ports. In the previous sentence, "influence" has the same meaning as "effect".

The specialist understands how he can build a circuit, the circuit being passive in the meaning of circuit theory and such that, if the impedance matrix seen by the antenna ports is equal to the given diagonal impedance matrix, the reactance of any one of the adjustable impedance devices has an influence (or an effect) on the impedance matrix presented by the user ports, and the reactance of at least one of the adjustable impedance devices has an influence on at least one non-diagonal entry of the impedance matrix presented by the user ports.

The specialist understands that the apparatus of the invention is different from the prior art plurality of independent antenna tuning apparatuses shown in FIG. 4, because this plurality of independent antenna tuning apparatuses is such that the impedance matrix presented by the user ports is always a diagonal matrix if the impedance matrix seen by the antenna ports is equal to a given diagonal impedance matrix.

Each of the n antenna ports is intended to be connected to an antenna. The n antennas may form an antenna array in which one or more interactions between the antennas cannot be neglected. The specialist understands that, in the apparatus of the invention, if each of the antenna ports is coupled, directly or through a feeder, to an antenna of an antenna array in which one or more interactions between the antennas cannot be neglected, the impedance matrix seen by the antenna ports is a non-diagonal matrix.

The apparatus of the invention may be such that, if the impedance matrix seen by the antenna ports is equal to a given non-diagonal impedance matrix, a mapping associating the impedance matrix presented by the user ports to the p reactances is defined, the mapping having, at a given value of each of the p reactances, a partial derivative with respect to each of the p reactances, a span of the p partial derivatives being defined in the set of the complex matrices of size m×m considered as a real vector space, any diagonal complex matrix of size m×m having the same diagonal entries as at least one element of the span of the p partial derivatives. This must be interpreted as meaning: the apparatus of the invention may be such that there exists a non-diagonal impedance matrix referred to as the given non-diagonal impedance matrix, the given non-diagonal impedance matrix being such that, if the impedance matrix seen by the antenna ports is equal to the given non-diagonal impedance matrix, then a mapping associating the impedance matrix presented by the user ports to the p reactances is defined, the mapping having, at a given value of each of the p reactances, a partial derivative with respect to each of the p reactances, a span of the p partial derivatives being defined in the set of the complex matrices of size m×m considered as a real vector space, any diagonal complex matrix of size m×m having the same diagonal entries as at least one element of the span of the p partial derivatives.

Let us use $Z_A$ to denote the impedance matrix seen by the antenna ports. Let us use $Z_U$ to denote the impedance matrix presented by the user ports. $Z_U$ may be considered as an element of the vector space of the complex matrices of size m×m over the field of the complex numbers, the dimension of this vector space being $m^2$. $Z_U$ may also be considered as an element of the vector space, denoted by E, of the complex matrices of size m×m over the field of the real numbers. The real vector space E is of dimension $2m^2$. Let us number the p adjustable impedance devices from 1 to p. For any integer j greater than or equal to 1 and less than or equal to p, let us use $X_j$ to denote the reactance of the adjustable impedance device number j. The specialist understands that $Z_U$ is a function of the complex matrix $Z_A$ and of the p real variables $X_1, \ldots, X_p$. In the case where $Z_A$ is equal to said given non-diagonal impedance matrix, let us use $f$ to denote the mapping defined above, by $$f(X_1, \ldots, X_p) = Z_U \quad (1)$$

At a given value of each of the p reactances, that is at $(X_1, \ldots, X_p) = (X_{1G}, \ldots, X_{pG})$ where $(X_{1G}, \ldots, X_{pG})$ is given, the mapping has, with respect to any reactance $X_j$ among the p reactances, a partial derivative $D_j(X_{1G}, \ldots, X_{pG})$, which may be denoted by $$\frac{\partial f}{\partial X_j}(X_{1G}, \ldots, X_{pG}) = D_j(X_{1G}, \ldots, X_{pG}) \quad (2)$$

The specialist understands that, if $Z_A$ is equal to said given non-diagonal impedance matrix, the mapping $f$ and the p sets of the possible values of the real variables $X_1, \ldots, X_p$ define the set of the possible values of $Z_U$. This set is an important characteristic of the apparatus for tuning n antennas. In the case where each of the p sets of the possible values of the real variables $X_1, \ldots, X_p$ is an interval and where the mapping $f$ is homeomorphic, the specialist understands that the set of the possible values of $Z_U$ is a differential manifold and that the inverse of $f$ is a chart of this set, which tells how to adjust the $X_1, \ldots, X_p$ to obtain a wanted value of $Z_U$.

The specialist understands that, because of the properties of antennas, $Z_A$ is the impedance matrix of a passive n-port. Thus, since the apparatus for tuning n antennas behaves, at any frequency in the given frequency band, with respect to its antenna ports and user ports, substantially as a passive linear device, $Z_U$ is the matrix of a passive n-port, so that $Z_U + Z_U^*$ is an hermitian matrix whose eigenvalues are positive or zero, that is to say a positive semidefinite matrix.

The above-mentioned requirement "any diagonal complex matrix of size m×m having the same diagonal entries as at least one element of the span of the p partial derivatives" means that any diagonal complex matrix of size m×m has the same diagonal entries as at least one element of the span of $D_1(X_{1G}, \ldots, X_{pG}), \ldots, D_p(X_{1G}, \ldots, X_{pG})$ in the real vector space E. The specialist understands that this requirement implies that it is possible to use the p adjustable impedance devices to control the absolute value and the phase of each diagonal entry of $Z_U$, independently from one another. The specialist also understands how he can meet this requirement.

According to the invention, the p partial derivatives may be linearly independent in the real vector space E. In this case, the specialist understands that there is no redundancy in the effect of an adjustment of the p adjustable impedance devices, so that it is possible to use the p adjustable impedance devices to independently control the absolute value and the phase of each diagonal entry of $Z_U$ and also p−2m constraints relating to the non-diagonal entries of $Z_U$. In this case, if p−2m is greater than or equal to 1, it may be possible to reduce the absolute value of the p−2m non-diagonal entries of $Z_U$ having the largest absolute value.

According to the invention, the span of the p partial derivatives may be such that any diagonal complex matrix of size m×m is an element of the span of the p partial derivatives. In this case, the span of $D_1(X_{1G}, \ldots, X_{pG}), \ldots, D_p(X_{1G}, \ldots, X_{pG})$ contains the set of the diagonal complex matrices of size m×m, which is a subspace of E, the dimension of this subspace being 2m. In this case, the specialist understands that it is possible to use the p adjustable impedance devices to independently control the absolute value and the phase of each diagonal entry of $Z_U$ and to cancel all non-diagonal entries of $Z_U$.

The specialist understands that, because of the properties of antennas, it is possible that $Z_A$ is the matrix of a reciprocal n-port, that is to say a symmetric matrix. In this case, if the apparatus for tuning n antennas behaves, at any frequency in the given frequency band, with respect to its antenna ports and user ports, substantially as a reciprocal linear device, $Z_U$ is the matrix of a reciprocal n-port, so that $Z_U$ is a symmetric matrix.

According to the invention, the span of the p partial derivatives may be such that any symmetric complex matrix of size m×m is an element of the span of the p partial derivatives. In this case, the span of $D_1(X_{1G}, \ldots, X_{pG}), \ldots, D_p(X_{1G}, \ldots, X_{pG})$ contains the set of the symmetric complex matrices of size m×m, which is a subspace of E, the dimension of this subspace being p=m(m+1).

The apparatus of the invention may be such that p=m(m+1). In this case, if $Z_A$ is symmetric, if the p partial derivatives are linearly independent in the real vector space E and if the apparatus of the invention behaves, for its antenna ports and its user ports, as a reciprocal circuit, any symmetric complex matrix of size m×m is an element of the span of the p partial derivatives. The number p may preferably be greater than or equal to 2m and less than or equal to m(m+1).

According to the invention, it is possible that one or more of the antenna ports and/or of the user ports are single-ended. According to the invention, it is possible that one or more of the antenna ports and/or of the user ports are balanced or symmetrical. Since n is an integer greater than or equal to 2, it is possible that n is greater than or equal to 3, and it is possible that n is greater than or equal to 4. Since m is an integer greater than or equal to 2, it is possible that m is greater than or equal to 3, and it is possible that m is greater than or equal to 4.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment

A first embodiment of an apparatus of the invention, for simultaneously tuning n antennas between which a non-negligible interaction exists, given by way of non-limiting example, is an antenna tuning apparatus for a multiport antenna array, characterized in that:
- the number of user ports is equal to the number of antenna ports, that is n=m;
- a circuit diagram and the component values of a decoupling and matching network are obtained using the method presented in the paper of J. Weber, C. Volmer, K. Blau, R. Stephan and M. A. Hein, entitled "Miniaturized Antenna Arrays Using Decoupling Networks With Realistic Elements", published in *IEEE Transactions on Microwave Theory and Techniques*, vol. 54, No. 6, pp. 2733-2740, in June 2006;
- to obtain a circuit diagram and the component values of the antenna tuning apparatus, p=m(m+1) components of the decoupling and matching network are each replaced with an adjustable impedance device, such that said p partial derivatives defined above by the equation (2) are linearly independent in the real vector space E, the reactance of any one of the adjustable impedance devices being adjustable by electrical means.

The specialist understands that, at a frequency at which the antenna tuning apparatus is intended to operate, if the impedance matrix seen by the antenna ports is a diagonal matrix having all its diagonal entries equal to 50Ω, the reactance of any one of the adjustable impedance devices has an influence on the impedance matrix presented by the user ports, and the reactance of one or more of the adjustable impedance devices has an influence on one or more of the non-diagonal entries of the impedance matrix presented by the user ports. The condition "if the impedance matrix seen by the antenna ports is a diagonal matrix having all its diagonal entries equal to 50Ω" does not reflect an intended use of the antenna tuning apparatus.

Figure 1:
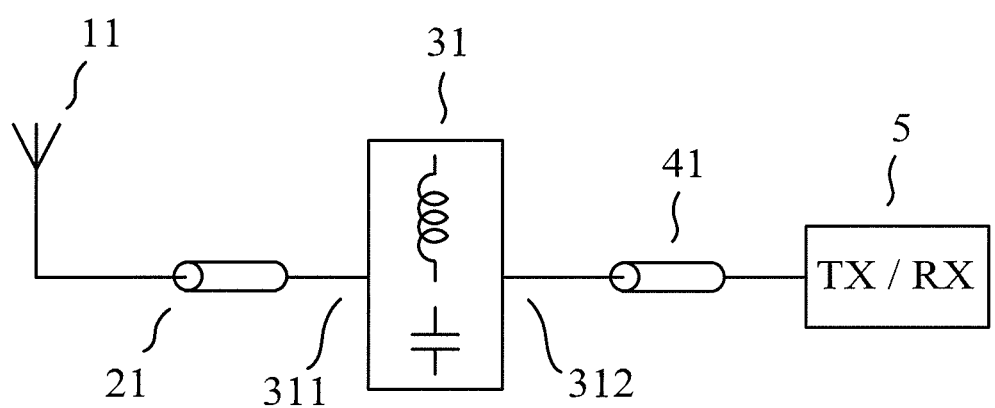
FIG. 1 shows a block diagram of a typical use of an antenna tuning apparatus for tuning a single antenna, and has already been discussed in the section dedicated to the presentation of the prior art.
Figure 2:
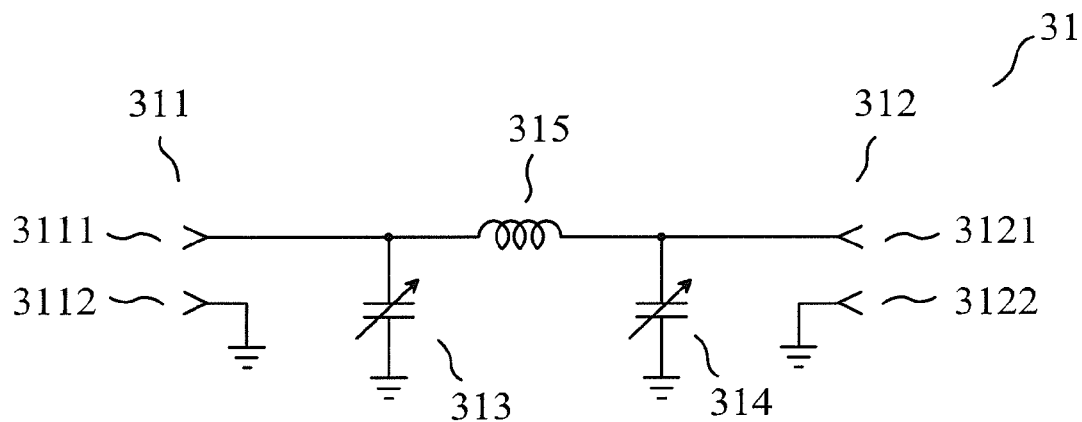
FIG. 2 shows a schematic diagram of a first antenna tuning apparatus which could be used as shown in FIG. 1 to tune a single antenna, and has already been discussed in the section dedicated to the presentation of the prior art.
Figure 3:
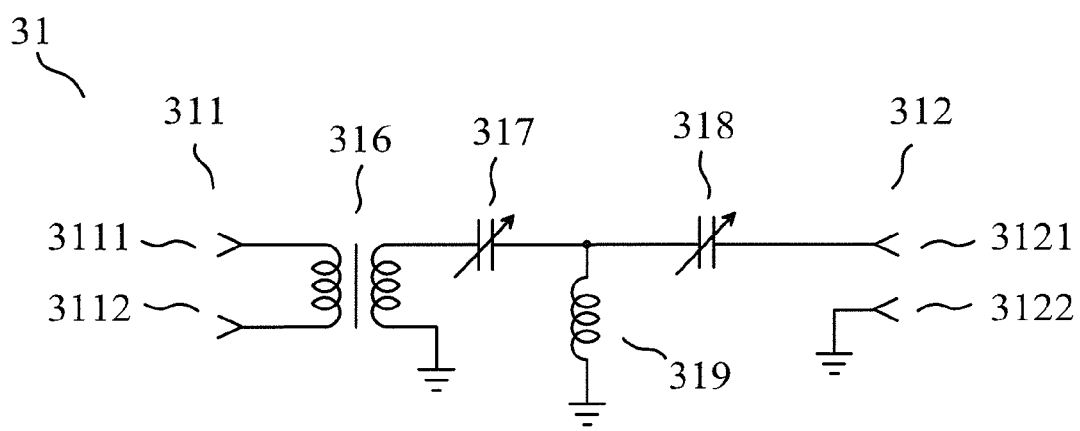
FIG. 3 shows a schematic diagram of a second antenna tuning apparatus which could be used as shown in FIG. 1 to tune a single antenna, and has already been discussed in the section dedicated to the presentation of the prior art.
Figure 4:
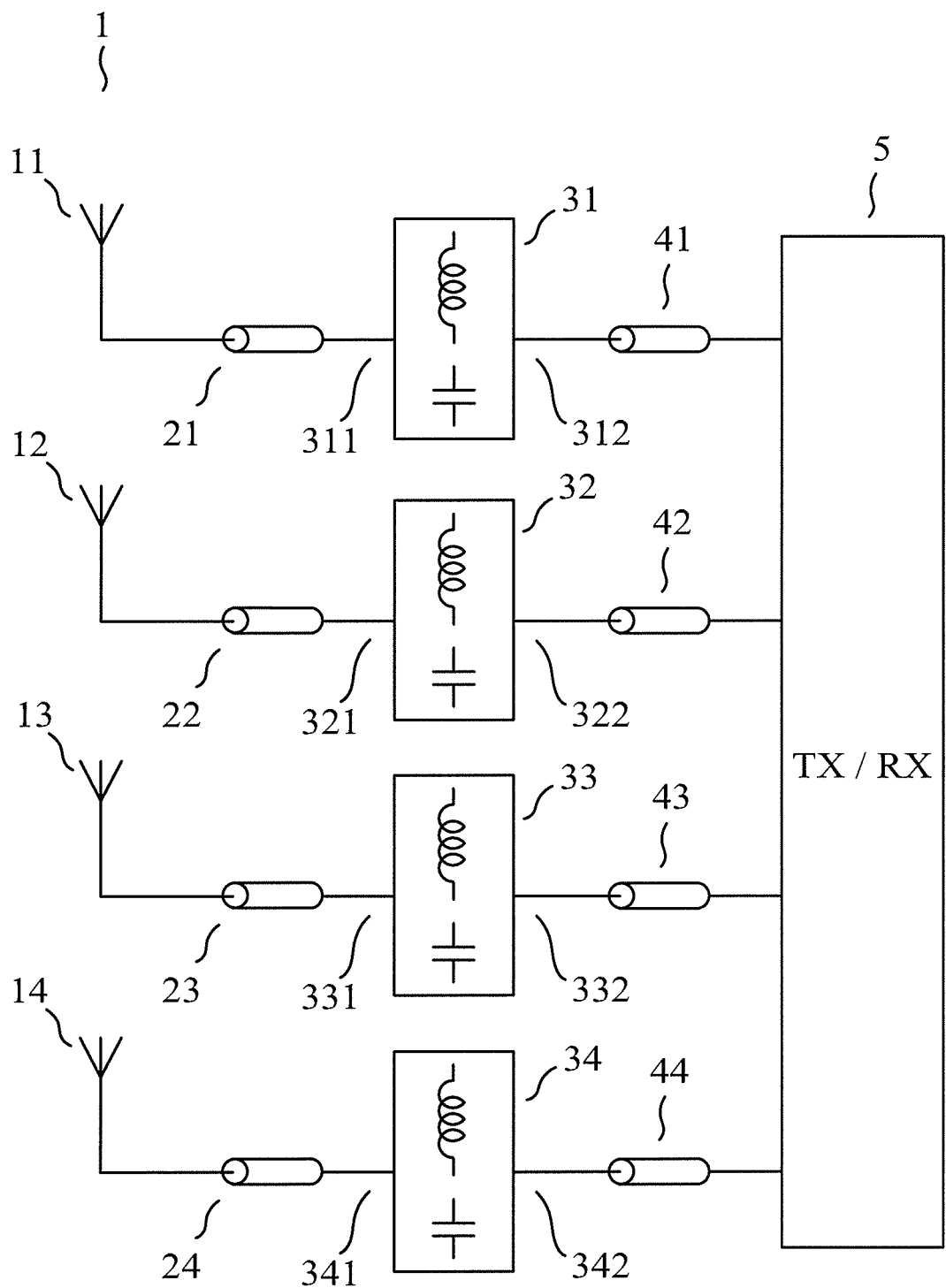
FIG. 4 shows a block diagram of a typical use of a plurality of antenna tuning apparatuses for simultaneously tuning 4 antennas, and has already been discussed in the section dedicated to the presentation of the prior art.

The specialist understands that the antenna tuning apparatus cannot be made up of a plurality of independent and uncoupled antenna tuning apparatuses each having a single antenna port and a single user port, as shown in FIG. 4, because in this case, if the impedance matrix seen by the antenna ports is equal to any diagonal impedance matrix, then the impedance matrix presented by the user ports is a diagonal matrix, the non-diagonal entries of which cannot be influenced by anything.

We note that the decoupling and matching network synthesized using the method presented in said paper of J. Weber, C. Volmer, K. Blau, R. Stephan and M. A. Hein comprises m (2m+1) components, only m(m+1) of which are replaced with said adjustable impedance devices. The specialist understands how he can determine if the partial derivatives are linearly independent in the real vector space E, for a given choice of m(m+1) adjustable impedance devices, to obtain an appropriate choice.

Figure 5:
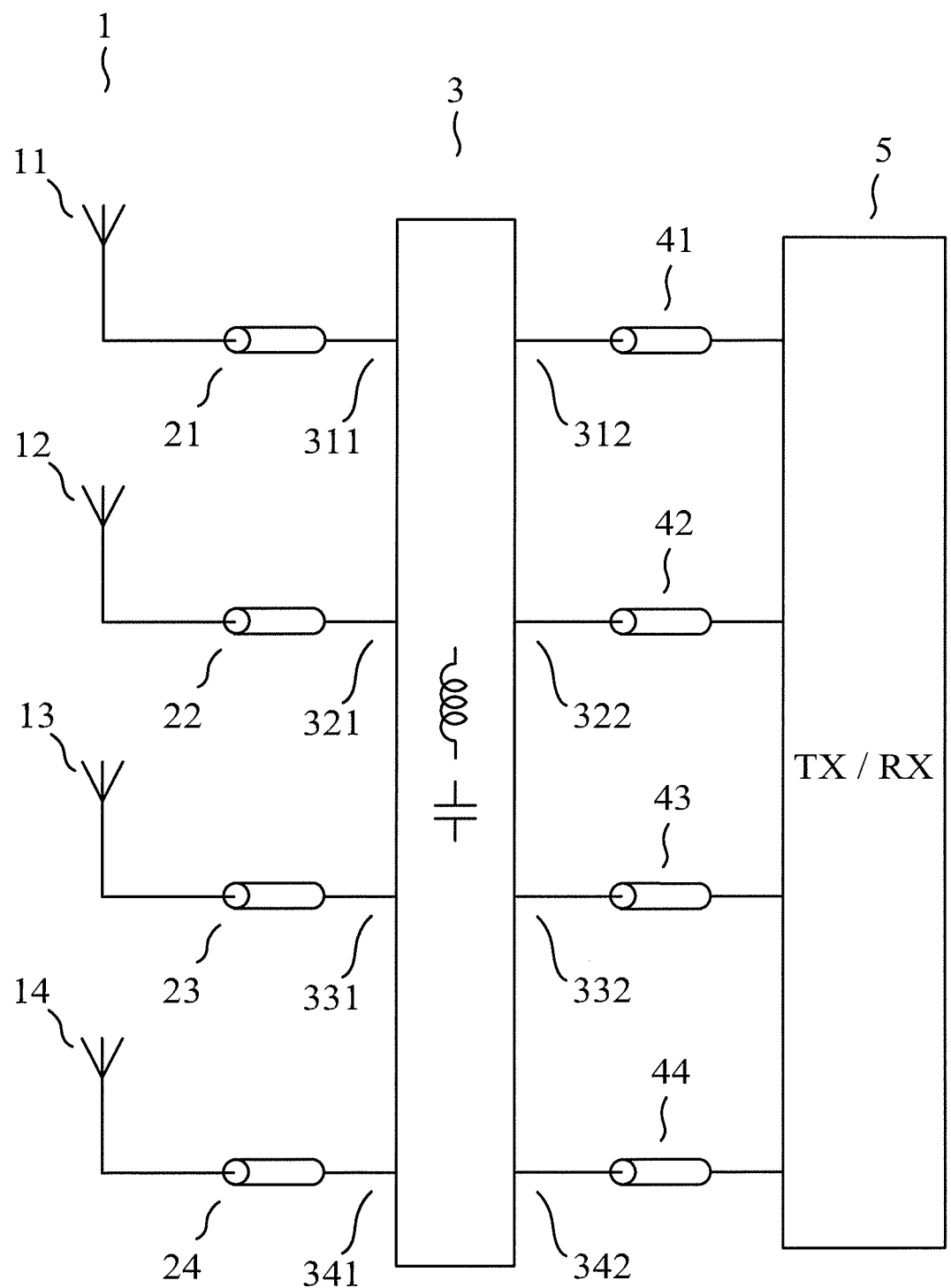
FIG. 5 shows a block diagram of a typical use of an antenna tuning apparatus for simultaneously tuning 4 antennas (first embodiment)

The FIG. 5 shows a block diagram of a typical use of the antenna tuning apparatus (3) for simultaneously tuning 4 antennas (11) (12) (13) (14), the 4 antennas operating in a given frequency band, the 4 antennas forming an antenna array (1). In FIG. 5, the antenna tuning apparatus (3) comprises:
- n=4 antenna ports (311) (321) (331) (341), each of the antenna ports being coupled to one of the antennas (11) (12) (13) (14) through a feeder (21) (22) (23) (24);
- m=4 user ports (312) (322) (332) (342), each of the user ports being coupled to the user (5) through an interconnection (41) (42) (43) (44);
- p=m (m+1)=20 adjustable impedance devices, the reactance of any one of the adjustable impedance devices being adjustable by electrical means.

In FIG. 5, the user (5) is a radio receiver or a radio transmitter or a radio transceiver which uses a plurality of antennas simultaneously, in the given frequency band.

The p partial derivatives being linearly independent in E, the specialist understands that a small variation in the impedance matrix of the antenna array, caused by a change in operating frequency or a change in the medium surrounding the antennas, can be compensated with a new adjustment of the adjustable impedance devices, for instance to obtain that the impedance matrix presented by the user ports is a wanted real diagonal matrix. Thus, it is always possible to obtain the best possible performance.

Second Embodiment

A second embodiment of an apparatus of the invention, for simultaneously tuning n antennas between which a non-negligible interaction exists, given by way of non-limiting example, is an antenna tuning apparatus for a multiport antenna array, characterized in that:
- n adjustable impedance devices are each coupled in parallel with one of the antenna ports and are each adjustable by electrical means;
- n(n−1)/2 adjustable impedance devices each have a first terminal coupled to one of the antenna ports and a second terminal coupled to one of the antenna ports which is different from the antenna port to which the first terminal is coupled;
- m adjustable impedance devices are each coupled in parallel with one of the user ports and are each adjustable by electrical means;
- m(m−1)/2 adjustable impedance devices each have a first terminal coupled to one of the user ports and a second terminal coupled to one of the user ports which is different from the user port to which the first terminal is coupled.

In practice, losses are undesirable for signals applied to the antenna ports or the user ports, in a frequency band at which the antenna tuning apparatus is intended to operate. Thus, the antenna tuning apparatus is ideally lossless for signals applied to its antenna ports or user ports, in this frequency band.

The specialist understands that, at a frequency at which the antenna tuning apparatus is intended to operate, if the impedance matrix seen by the antenna ports is a diagonal matrix having all its diagonal entries equal to 50Ω, the reactance of any one of the adjustable impedance devices has an influence on the impedance matrix presented by the user ports, and the reactance of one or more of the adjustable impedance devices has an influence on one or more of the non-diagonal entries of the impedance matrix presented by the user ports.

Third Embodiment

Best Mode

Figure 6:
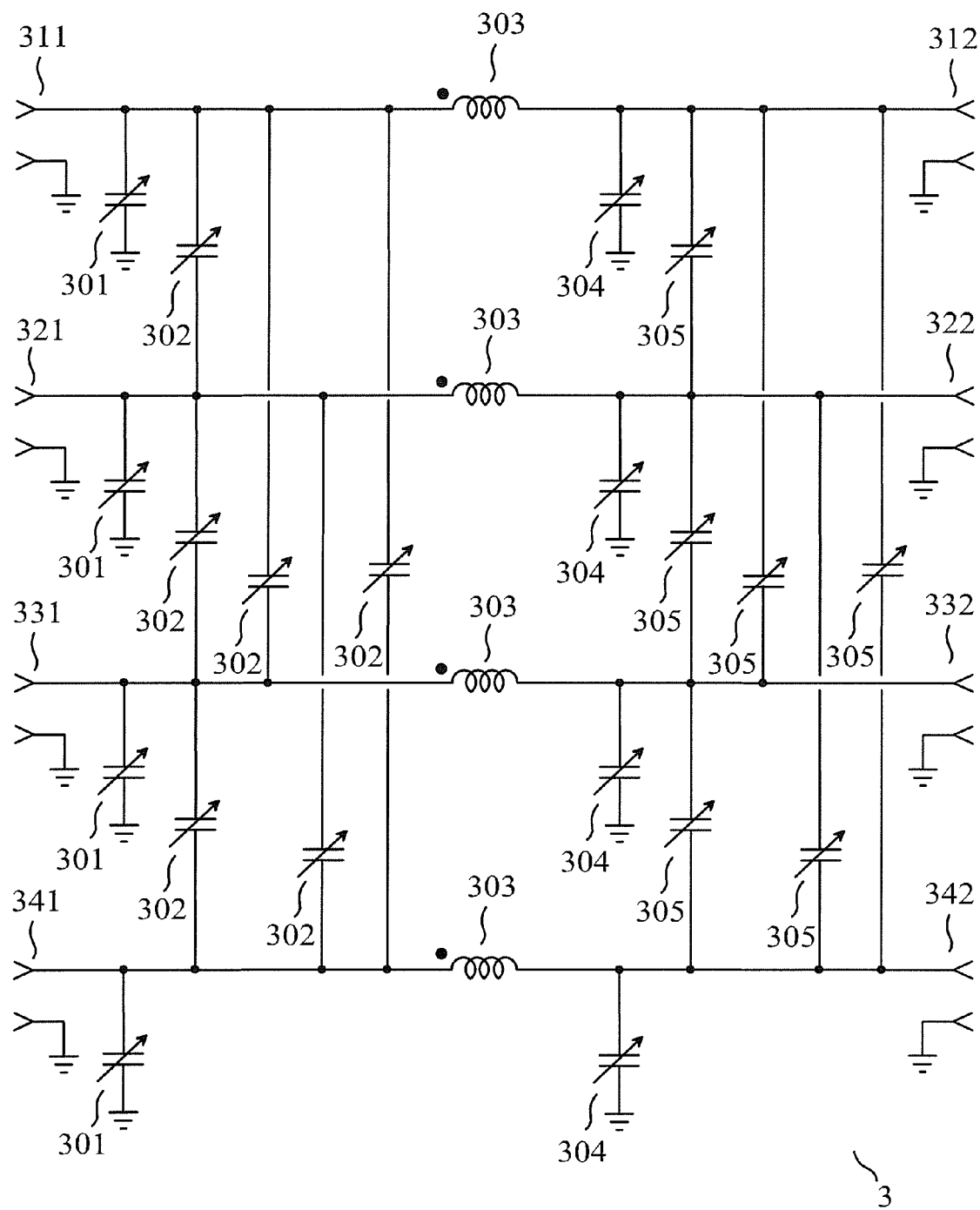
FIG. 6 shows a schematic diagram of an antenna tuning apparatus for simultaneously tuning 4 antennas (third embodiment)

As a third embodiment of an apparatus of the invention, given by way of non-limiting example and best mode of carrying out the invention, we have represented in FIG. 6 an antenna tuning apparatus for a multiport antenna array, comprising:

- n=4 antenna ports (311) (321) (331) (341), each of the antenna ports being single-ended;
- m=4 user ports (312) (322) (332) (342), each of the user ports being single-ended;
- n adjustable impedance devices (301) each presenting a negative reactance and each being coupled in parallel with one of the antenna ports;
- n(n−1)/2 adjustable impedance devices (302) each presenting a negative reactance and each having a first terminal coupled to one of the antenna ports and a second terminal coupled to one of the antenna ports which is different from the antenna port to which the first terminal is coupled;
- n=m windings (303) each having a first terminal coupled to one of the antenna ports and a second terminal coupled to one of the user ports;
- m adjustable impedance devices (304) each presenting a negative reactance and each being coupled in parallel with one of the user ports;
- m(m−1)/2 adjustable impedance devices (305) each presenting a negative reactance and each having a first terminal coupled to one of the user ports and a second terminal coupled to one of the user ports which is different from the user port to which the first terminal is coupled.

All adjustable impedance devices (301) (302) (304) (305) are adjustable by electrical means, but the circuits and the control links needed to determine the reactance of each of the adjustable impedance devices are not shown in FIG. 6.

We note that this third embodiment is a special case of the second embodiment, in which n=m, so that it uses p=m(m+1) adjustable impedance devices. We also note that none of the user ports is directly coupled to any one of the antenna ports.

The specialist understands that the antenna tuning apparatus is reciprocal with respect to the antenna ports or user ports. Thus, the antenna tuning apparatus can be used for radio reception (in which case the user behaves as a radio receiver) and for radio emission (in which case the user behaves as a radio transmitter).

The specialist understands that, in practice, because of the properties of antennas, it is possible that $Z_A$ is the matrix of a passive and reciprocal n-port, that is to say a symmetric matrix having a positive semidefinite real part. In this case, since the antenna tuning apparatus shown in FIG. 6 obviously behaves, at any frequency, with respect to its antenna and user ports, substantially as a passive reciprocal linear device, $Z_U$ is the matrix of a passive reciprocal n-port, so that $Z_U$ is a symmetric matrix having a positive semidefinite real part.

The apparatus of this third embodiment may be used as shown in FIG. 5, the array of antennas being for instance made of 4 identical and parallel (hence of the same polarization) antennas, these antennas being close to each other and intended to operate in the frequency band 1850 MHz to 1910 MHz. At the center frequency of 1880 MHz, the impedance matrix $Z_A$ is approximately given by:

$$Z_A \approx \begin{pmatrix} 84.4+10.1j & -18.7-32.5j & -17.9+13.5j & -18.7-32.5j \\ -18.7-32.5j & 84.4+10.1j & -18.7-32.5j & -17.9+13.5j \\ -17.9+13.5j & -18.7-32.5j & 84.4+10.1j & -18.7-32.5j \\ -18.7-32.5j & -17.9+13.5j & -18.7-32.5j & 84.4+10.1j \end{pmatrix} \Omega \quad (3)$$

Here, $Z_A$ given by the equation (3) is the matrix of a passive and reciprocal n-port, that is a symmetric matrix having a positive semidefinite real part. Thus, $Z_U$ is the matrix of a passive and reciprocal n-port, that is a symmetric matrix having a positive semidefinite real part.

The specialist knows how to determine the capacitance of each of the adjustable impedance devices (301) (302) coupled to one of the antenna ports, the inductance of each of the windings (303), the mutual inductance between the windings (303), and the capacitance of each of the adjustable impedance devices (304) (305) coupled to one of the user ports, to obtain a wanted impedance matrix $Z_U$, at the center frequency. For instance, if $C_A$ is used to denote the capacitance matrix of the adjustable impedance devices (301) (302) coupled to one of the antenna ports, if L is used to denote the inductance matrix of the windings (303) and if $C_U$ is used to denote the capacitance matrix of the adjustable impedance devices (304) (305) coupled to one of the user ports, we find that the approximate values $$C_A \approx \begin{pmatrix} 10.20 & -2.10 & -1.20 & -2.10 \\ -2.10 & 10.20 & -2.10 & -1.20 \\ -1.20 & -2.10 & 10.20 & -2.10 \\ -2.10 & -1.20 & -2.10 & 10.20 \end{pmatrix} \text{pF} \quad (4)$$

$$L \approx \begin{pmatrix} 1.238 & 0.282 & 0.180 & 0.282 \\ 0.282 & 1.238 & 0.282 & 0.180 \\ 0.180 & 0.282 & 1.238 & 0.282 \\ 0.282 & 0.180 & 0.282 & 1.238 \end{pmatrix} \text{nH} \quad (5)$$

and $$C_U \approx \begin{pmatrix} 16.23 & -4.03 & -0.07 & -4.03 \\ -4.03 & 16.23 & -4.03 & -0.07 \\ -0.07 & -4.03 & 16.23 & -4.03 \\ -4.03 & -0.07 & -4.03 & 16.23 \end{pmatrix} \text{pF} \quad (6)$$

are suitable to obtain $$Z_U \approx \begin{pmatrix} 50.0 & 0.0 & 0.0 & 0.0 \\ 0.0 & 50.0 & 0.0 & 0.0 \\ 0.0 & 0.0 & 50.0 & 0.0 \\ 0.0 & 0.0 & 0.0 & 50.0 \end{pmatrix} \Omega \quad (7)$$

given by the general formula $$Z_U = \left[ \left[ [Z_A^{-1} + j\omega C_A]^{-1} + j\omega L \right]^{-1} + j\omega C_U \right]^{-1} \quad (8)$$

For these values, it is possible to show that the p=20 partial derivatives defined above by the equation (2) are linearly independent in the real vector space of dimension 32 of the complex matrices of size 4×4, denoted by E. Thus, the span of the p partial derivatives in E is a subspace of dimension 20 equal to the set of the symmetric complex matrices of size 4×4. Consequently, any diagonal complex matrix of size 4×4 has the same diagonal entries as at least one element of the span of the p partial derivatives.

The specialist understands that any small variation in the impedance matrix of the n antennas can be compensated with a new adjustment of the adjustable impedance devices. The proof of this statement, for any value of n=m≥2, is as follows. Here E is a real vector space of dimension $2n^2$. We shall use S to denote the set of the symmetric complex matrices of size n×n over the field of the real numbers. S is a subspace of E and S is of dimension q=n(n+1). We shall use B to denote a basis of S. We assume that $Z_A$ is the matrix of a reciprocal n-port, so that $Z_A$ lies in S, and we shall use $Z_{A1}, \ldots, Z_{Aq}$ to denote the coordinates of $Z_A$ with respect to the basis B. We assume that the antenna tuning apparatus behaves, with respect to its antenna and user ports, substantially as a reciprocal linear device, so that $Z_U$ lies in S, and we shall use $Z_{U1}, \ldots, Z_{Uq}$ to denote the coordinates of $Z_U$ with respect to the basis B. Since $Z_U$ is a function of the complex matrix $Z_A$ and of the p real variables $X_1, \ldots, X_p$, we define q functions $g_1, \ldots, g_q$ such that, for any integer i greater than or equal to 1 and less than or equal to q, $$g_i(Z_{A1}, \ldots, Z_{Aq}, X_1, \ldots, X_p) = Z_{Ui} \quad (9)$$

Since $Z_U$ lies in S for any values of $X_1, \ldots, X_p$, the partial derivatives defined above by the equation (2), which are partial derivatives of the function $f$ defined above, lie in S. Let us use $J_X$ to denote the matrix of size q×p whose entry of the row i and column j is given by $$J_{Xij} = \frac{\partial g_i}{\partial X_j} \quad (10)$$

We see that $J_X$ is a Jacobian matrix. If we now assume that the p partial derivatives defined by the equation (2) are linearly independent in E and that p=q, we find that $J_X$ is a square and invertible matrix of size p×p. An arbitrary small variation in the impedance matrix of the antenna array corresponds to small variations $dZ_{A1}, \ldots, dZ_{Ap}$ in the variables $Z_{A1}, \ldots, Z_{Ap}$, respectively. An arbitrary small variation in the reactances of the adjustable impedance devices corresponds to small variations $dX_1, \ldots, dX_p$ in the variables $X_1, \ldots, X_p$, respectively. The arbitrary small variation in the impedance matrix of the antenna array and the arbitrary small variation in the reactances of the adjustable impedance devices produce small variations $dZ_{U1}, \ldots, dZ_{Up}$ in the variables $Z_{U1}, \ldots, Z_{Up}$, respectively. We have $$dZ_{Ui} = \sum_{j=1}^{p} \frac{\partial g_i}{\partial Z_{Aj}} dZ_{Aj} + \sum_{j=1}^{p} \frac{\partial g_i}{\partial X_j} dX_j \quad (11)$$

which may be cast in the form $$\begin{pmatrix} dZ_{U1} \\ \vdots \\ dZ_{Up} \end{pmatrix} = J_A \begin{pmatrix} dZ_{A1} \\ \vdots \\ dZ_{Ap} \end{pmatrix} + J_X \begin{pmatrix} dX_1 \\ \vdots \\ dX_p \end{pmatrix} \quad (12)$$

where we use $J_A$ to denote the matrix of size p×p whose entry of the row i and column j is given by $$J_{Aij} = \frac{\partial g_i}{\partial Z_{Aj}} \quad (13)$$

A compensation of the small variation in the impedance matrix of the antenna array is obtained with a new adjustment in the reactances of the adjustable impedance devices if and only if we can find $dX_1, \ldots, dX_p$ such that $dZ_{U1} = \ldots = dZ_{Up} = 0$. Since, as explained above, $J_X$ is an invertible matrix, this problem has a unique solution, which is given by $$\begin{pmatrix} dX_1 \\ \vdots \\ dX_p \end{pmatrix} = -J_X^{-1} J_A \begin{pmatrix} dZ_{A1} \\ \vdots \\ dZ_{Ap} \end{pmatrix} \quad (14)$$

Consequently, we have established that our assumptions lead us to the conclusion that any small variation in the impedance matrix of the antenna array can be compensated with a new adjustment of the adjustable impedance devices, if each of the adjustable impedance devices provides an adequate set of reactance values, for instance a continuous set of reactance values.

Thus, the specialist understands that, for the antenna tuning apparatus shown in FIG. 6, any small variation in the impedance matrix of the antenna array, caused by a change in operating frequency or a change in the medium surrounding the antennas, can be compensated with a new adjustment of the adjustable impedance devices, for instance to obtain the real diagonal matrix given by the equation (7). Thus, it is always possible to obtain the best possible performance. In particular, if the multiport antenna array is built in a portable transceiver, for instance a user equipment (UE) of an LTE wireless network, the body of the user has an effect on $Z_A$, and $Z_A$ depends on the position of the body of the user. This is referred to as "user interaction", or "hand effect" or "finger effect". The specialist understands that the antenna tuning apparatus may be used to compensate the user interaction.

More generally, we see that an apparatus for tuning n antennas, where n is an integer greater than or equal to two, the n antennas operating in a given frequency band, the apparatus comprising n antenna ports (311) (321) (331) (341) and m user ports (312) (322) (332) (342), where m is an integer greater than or equal to two, may be characterized in that:

the apparatus comprises n adjustable impedance devices (301) each coupled in parallel with one of the antenna ports;

the apparatus comprises n(n−1)/2 adjustable impedance devices (302) each having a first terminal coupled to one of the antenna ports and a second terminal coupled to one of the antenna ports which is different from the antenna port to which the first terminal is coupled;

the apparatus comprises m adjustable impedance devices (304) each coupled in parallel with one of the user ports;

the apparatus comprises m(m−1)/2 adjustable impedance devices (305) each having a first terminal coupled to one of the user ports and a second terminal coupled to one of the user ports which is different from the user port to which the first terminal is coupled;

none of the user ports is directly coupled to any one of the antenna ports; and each of the adjustable impedance devices (301) (302) (304) (305) has a reactance at a frequency in said given frequency band, the reactance of any one of the adjustable impedance devices being adjustable by electrical means.

The specialist understands that this apparatus for tuning n antennas is such that, at a frequency at which the antenna tuning apparatus is intended to operate, if the impedance matrix seen by the antenna ports is a diagonal matrix having all its diagonal entries equal to 50Ω, the reactance of any one of the adjustable impedance devices has an influence on the impedance matrix presented by the user ports, and the reactance of one or more of the adjustable impedance devices has an influence on one or more of the non-diagonal entries of the impedance matrix presented by the user ports.

The specialist understands that, in the case n=m, such an apparatus for tuning n antennas may be proportioned such that said p=n(n+1) partial derivatives defined above by the equation (2) are linearly independent in the real vector space of the complex matrices of size n×n. Consequently, any small variation in the impedance matrix of the n antennas, caused by a change in operating frequency or a change in the medium surrounding the antennas, can be compensated with a new adjustment of the adjustable impedance devices, using only p=n(n+1) adjustable impedance devices.

In the special case n=m=2, it is interesting to note that such an apparatus of the invention for tuning 2 antennas needs only 6 adjustable impedance devices to compensate any small variation in the impedance matrix of the 2 antennas, whereas said "connection circuit" disclosed in said article of S. M. Ali and J. Warden, if it can provide this result, is such that 12 adjustable parameters are needed, as explained in the prior art section. Consequently, an apparatus of the invention for tuning 2 antennas is much more effective and less expensive than said "connection circuit" to obtain this wanted result, if said "connection circuit" can provide this wanted result.

Fourth Embodiment

Figure 7:
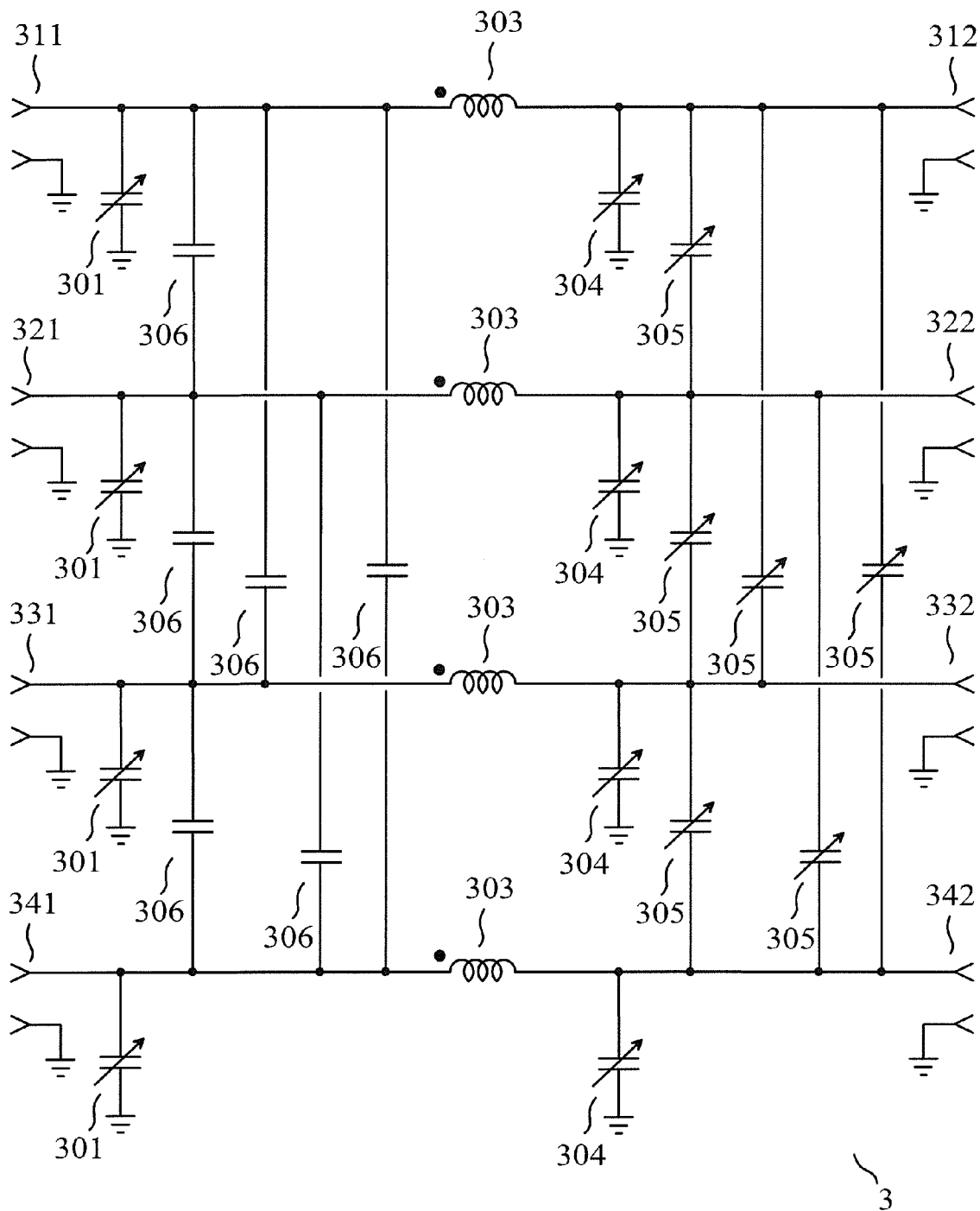
FIG. 7 shows a schematic diagram of an antenna tuning apparatus for simultaneously tuning 4 antennas (fourth embodiment)

As a fourth embodiment of an apparatus of the invention, given by way of non-limiting example, we have represented in FIG. 7 an antenna tuning apparatus of the invention, comprising:

n=4 antenna ports (311) (321) (331) (341), each of the antenna ports being single-ended;

m=4 user ports (312) (322) (332) (342), each of the user ports being single-ended;

n adjustable impedance devices (301) each presenting a negative reactance and each being coupled in parallel with one of the antenna ports;

n(n−1)/2 capacitors (306) each having a first terminal coupled to one of the antenna ports and a second terminal coupled to one of the antenna ports which is different from the antenna port to which the first terminal is coupled;

n=m windings (303) each having a first terminal coupled to one of the antenna ports and a second terminal coupled to one of the user ports;

m adjustable impedance devices (304) each presenting a negative reactance and each being coupled in parallel with one of the user ports;

m(m−1)/2 adjustable impedance devices (305) each presenting a negative reactance and each having a first terminal coupled to one of the user ports and a second terminal coupled to one of the user ports which is different from the user port to which the first terminal is coupled.

It is possible that mutual induction exists between the windings (303). In this case, the inductance matrix of the windings is not a diagonal matrix.

All adjustable impedance devices (301) (304) (305) are adjustable by electrical means, but the circuits and the control links needed to determine the reactance of each of the adjustable impedance devices are not shown in FIG. 7.

The specialist understands that, at a frequency at which the antenna tuning apparatus is intended to operate, if the impedance matrix seen by the antenna ports is a diagonal matrix having all its diagonal entries equal to 50Ω, the reactance of any one of the adjustable impedance devices has an influence on the impedance matrix presented by the user ports, and the reactance of one or more of the adjustable impedance devices has an influence on one or more of the non-diagonal entries of the impedance matrix presented by the user ports.

At the center frequency of 1880 MHz, for an impedance matrix $Z_A$ approximately given by the equation (3) and suitable component values leading to an impedance matrix $Z_U$ given by the equation (7), it is possible to show that the p=14 partial derivatives defined by the equation (2) are linearly independent in E. Thus, the span of the p partial derivatives in E is of dimension 14. It is also possible to show that any diagonal complex matrix of size 4×4 has the same diagonal entries as at least one element of the span of the p partial derivatives.

The specialist understands that any small variation in the impedance matrix of the antenna array, caused by a change in operating frequency or a change in the medium surrounding the antennas, can be partially compensated with a new adjustment of the adjustable impedance devices, for instance to obtain that each diagonal entry of $Z_U$ is close to 50Ω and that some of the non-diagonal entries of $Z_U$ have a sufficiently small absolute value.

Fifth Embodiment

Figure 8:
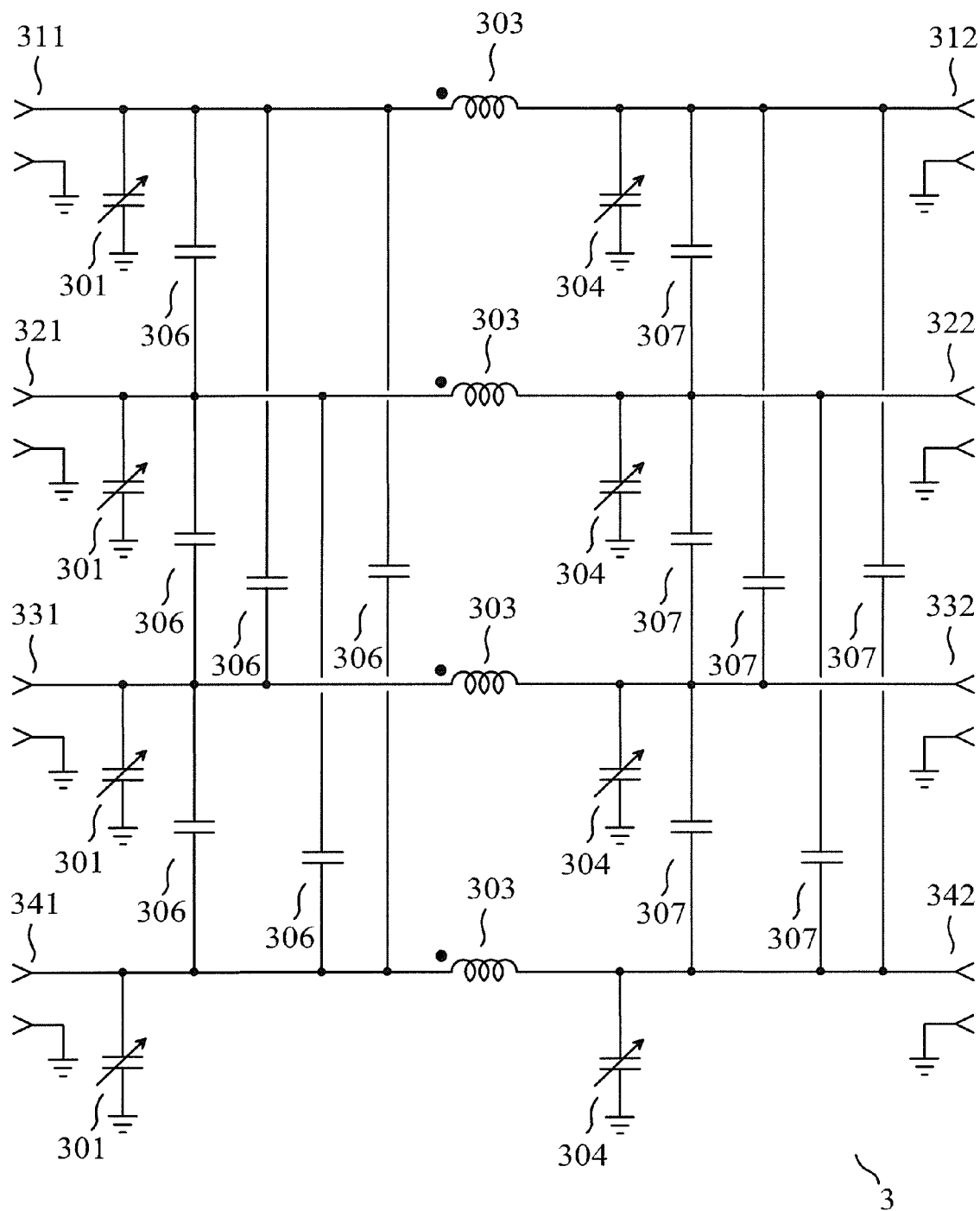
FIG. 8 shows a schematic diagram of an antenna tuning apparatus for simultaneously tuning 4 antennas (fifth embodiment).

As a fifth embodiment of an apparatus of the invention, given by way of non-limiting example, we have represented in FIG. 8 an antenna tuning apparatus of the invention, comprising:

n=4 antenna ports (311) (321) (331) (341), each of the antenna ports being single-ended;

m=4 user ports (312) (322) (332) (342), each of the user ports being single-ended;

n adjustable impedance devices (301) each presenting a negative reactance and each being coupled in parallel with one of the antenna ports;

n(n−1)/2 capacitors (306) each having a first terminal coupled to one of the antenna ports and a second terminal coupled to one of the antenna ports which is different from the antenna port to which the first terminal is coupled;

n=m windings (303) each having a first terminal coupled to one of the antenna ports and a second terminal coupled to one of the user ports;

m adjustable impedance devices (304) each presenting a negative reactance and each being coupled in parallel with one of the user ports;

m(m−1)/2 capacitors (307) each having a first terminal coupled to one of the user ports and a second terminal coupled to one of the user ports which is different from the user port to which the first terminal is coupled.

It is possible that mutual induction exists between two or more of the windings (303), so that in this case the inductance matrix of the windings is not a diagonal matrix.

All adjustable impedance devices (301) (304) are adjustable by electrical means, but the circuits and the control links needed to determine the reactance of each of the adjustable impedance devices are not shown in FIG. 8.

The specialist understands that, at a frequency at which the antenna tuning apparatus is intended to operate, if the impedance matrix seen by the antenna ports is a diagonal matrix having all its diagonal entries equal to 50Ω, the reactance of any one of the adjustable impedance devices has an influence on the impedance matrix presented by the user ports, and the reactance of one or more of the adjustable impedance devices has an influence on one or more of the non-diagonal entries of the impedance matrix presented by the user ports.

At the center frequency of 1880 MHz, for an impedance matrix $Z_A$ approximately given by the equation (3) and suitable component values leading to an impedance matrix $Z_U$ given by the equation (7), it is possible to show that the p=8 partial derivatives defined by the equation (2) are linearly independent in E. Thus, the span of the p partial derivatives in E is of dimension 8. It is also possible to show that any diagonal complex matrix of size 4×4 has the same diagonal entries as at least one element of the span of the p partial derivatives.

The specialist understands that any small variation in the impedance matrix of the antenna array, caused by a change in operating frequency or a change in the medium surrounding the antennas, can be partially compensated with a new adjustment of the adjustable impedance devices, for instance to obtain that each diagonal entry of $Z_U$ is close to 50Ω.

More generally, a specialist understands that, to obtain that any diagonal complex matrix of size m×m has the same diagonal entries as at least one element of the span of the p partial derivatives, it is necessary that the dimension of the span of the p partial derivatives considered as a real vector space is greater than or equal to the dimension of the subspace of the diagonal complex matrices of size m×m considered as a real vector space. Since the dimension of the span of the p partial derivatives considered as a real vector space is less than or equal to p, and since the dimension of the subspace of the diagonal complex matrices of size m×m considered as a real vector space is equal to 2m, the necessary condition implies that p is an integer greater than or equal to 2m. This is why the requirement "p is an integer greater than or equal to 2m" is an essential characteristic of the invention.

More generally, the specialist understands that an apparatus for tuning n antennas, referred to as apparatus C, where n is an integer greater than or equal to two, the n antennas operating in a given frequency band, the apparatus comprising n antenna ports (311) (321) (331) (341) and n user ports (312) (322) (332) (342), may be characterized in that:

the apparatus comprises n adjustable impedance devices (301) each coupled in parallel with one of the antenna ports;

the apparatus comprises n adjustable impedance devices (304) each coupled in parallel with one of the user ports;

the apparatus comprises one or more passive linear two-terminal circuit elements (306) each having a first terminal coupled to one of the antenna ports and a second terminal coupled to one of the antenna ports which is different from the antenna port to which the first terminal is coupled, and/or the apparatus comprises one or more passive linear two-terminal circuit elements (307) each having a first terminal coupled to one of the user ports and a second terminal coupled to one of the user ports which is different from the user port to which the first terminal is coupled;

the apparatus comprises n windings (303) each having a first terminal coupled to one of the antenna ports and a second terminal coupled to one of the user ports; and each of the adjustable impedance devices (301) (304) has a reactance at a frequency in said given frequency band, the reactance of any one of the adjustable impedance devices being adjustable by electrical means.

Also, the specialist understands that an apparatus for tuning n antennas, referred to as apparatus D, where n is an integer greater than or equal to two, the n antennas operating in a given frequency band, the apparatus comprising n antenna ports (311) (321) (331) (341) and n user ports (312) (322) (332) (342), may be characterized in that:

the apparatus comprises n adjustable impedance devices (301) each coupled in parallel with one of the antenna ports;

the apparatus comprises n adjustable impedance devices (304) each coupled in parallel with one of the user ports;

the apparatus comprises n windings (303) each having a first terminal coupled to one of the antenna ports and a second terminal coupled to one of the user ports;

mutual induction exists between two or more of the windings (303); and each of the adjustable impedance devices (301) (304) has a reactance at a frequency in said given frequency band, the reactance of any one of the adjustable impedance devices being adjustable by electrical means.

The specialist understands that the apparatus C and the apparatus D are such that, at a frequency at which the antenna tuning apparatus is intended to operate, if the impedance matrix seen by the antenna ports is a diagonal matrix any diagonal entry of which is a strictly positive real number, the reactance of any one of the adjustable impedance devices has an influence on the impedance matrix presented by the user ports, and the reactance of one or more of the adjustable impedance devices has an influence on one or more of the non-diagonal entries of the impedance matrix presented by the user ports.

Additionally, as shown in the third embodiment, any one of the apparatus C or the apparatus D may be characterized in that:

the apparatus comprises n(n−1)/2 additional adjustable impedance devices (302) each having a first terminal coupled to one of the antenna ports and a second terminal coupled to one of the antenna ports which is different from the antenna port to which the first terminal is coupled, each of the additional adjustable impedance devices (302) having a reactance at said frequency in said given frequency band, the reactance of any one of the additional adjustable impedance devices being adjustable by electrical means; and/or in that the apparatus comprises n(n−1)/2 additional adjustable impedance devices (305) each having a first terminal coupled to one of the user ports and a second terminal coupled to one of the user ports which is different from the user port to which the first terminal is coupled, each of the additional adjustable impedance devices (305) having a reactance at said frequency in said given frequency band, the reactance of any one of the additional adjustable impedance devices being adjustable by electrical means.

INDICATIONS ON INDUSTRIAL APPLICATIONS

The specialist understands that the antenna tuning apparatus of the invention is suitable for compensating the variations in the impedance matrix of an antenna array, using a reduced number of electrical signals to determine the reactance of each of the adjustable impedance devices. The invention is therefore particularly suitable for being used in an automatic antenna tuning system for simultaneously tuning a plurality of antennas.

We note that in the FIGS. 6, 7 and 8 presented in the third, fourth and fifth embodiments, each adjustable impedance device presents a negative reactance. This is not at all a characteristic of the invention, and it is also possible to use adjustable impedance devices presenting a positive reactance. However, the specialist understands that the third, fourth and fifth embodiments use a small number of windings, so that it is possible to obtain low losses in the antenna tuning apparatus.

It should also be noted that we have said several times that an adjustable impedance device has a reactance at a frequency, the reactance being adjustable by electrical means. This does not imply that the impedance of the adjustable impedance device is purely reactive, or equivalently that the resistance of the adjustable impedance device is substantially zero. This might be desirable in some cases, for instance to obtain low losses, but this is not at all a characteristic of the invention. An adjustable impedance device used in the invention may have a resistance which is not substantially zero, and this resistance may vary when the reactance of the adjustable impedance device varies.

The invention may be used in receivers and transmitters for radio communication which use a plurality of antennas simultaneously, in the same frequency band, for instance receivers and transmitters for MIMO radio communication. In particular, the invention provides the best possible characteristics using very close antennas, hence presenting a strong interaction between the antennas. The invention is therefore particularly suitable for mobile receivers and transmitters, for instance those used in portable radiotelephones. The invention is also particularly suitable for high-performance receivers and transmitters using a large number of antennas, for instance those used in the fixed stations of cellular radiotelephony networks.

The invention claimed is:

1. An apparatus for tuning a plurality of antennas, the plurality of antennas operating in a given frequency band, the apparatus comprising:

n antenna ports electrically connected to the plurality of antennas, n being an integer greater than or equal to three;

m user ports, m being an integer greater than or equal to three;

first adjustable impedance elements, each being electrically connected to one of the antenna ports and ground;

second adjustable impedance elements, each being electrically connected to one of the user ports and another one of the user ports; and windings, each being electrically connected to one of the antenna ports and one of the user ports, wherein the first and second adjustable impedance elements are configured to be electronically adjustable based on variation of impedance matrix presented by the user ports, and wherein the plurality of antennas are configured to be simultaneously tuned.

2. The apparatus of claim 1, wherein at least one of the second adjustable impedance elements is electrically connected to two of the user ports not to be adjacent.

3. The apparatus of claim 2, wherein mutual induction exists between two or more of the windings.

4. The apparatus of claim 1, wherein the third adjustable impedance elements comprise m(m−1)/2 adjustable impedance elements, each having a first terminal coupled to a first terminal of one of the antenna ports and each having a second terminal coupled to a second terminal of the one of the antenna ports.

5. The apparatus of claim 4, wherein each of the third adjustable impedance elements is selected from a group consisting of an adjustable impedance device and a passive linear two-terminal circuit element.

6. The apparatus of claim 1, wherein the antenna ports seeing, at a frequency in the given frequency band, an impedance matrix referred to as the impedance matrix seen by the antenna ports, the impedance matrix seen by the antenna ports being a complex matrix of size n×n, and wherein the user ports presenting, at the frequency in the given frequency band, an impedance matrix referred to as the impedance matrix presented by the user ports, the impedance matrix presented by the user ports being a complex matrix of size m×m.

7. The apparatus of claim 6, wherein the apparatus configured to tune the plurality of antennas by:

generating a diagonal impedance matrix referred to as a given diagonal impedance matrix, determining whether the impedance matrix seen by the antenna ports is equal to the given diagonal impedance matrix, ascertaining, when the impedance matrix seen by the antenna ports is equal to the given diagonal impedance matrix, the impedance matrix presented by the user ports depends on the reactance of any one of the second adjustable impedance elements, and at least one non-diagonal entry of the impedance matrix presented by the user ports depends on the reactance of at least one of the second adjustable impedance elements, and controlling, based on the ascertaining, an absolute value and phase of the at least one non-diagonal entry independently from other entries of the impedance matrix presented by the user ports.

8. The apparatus of claim 1, wherein the second adjustable impedance elements comprise $n(n-1)/2$ adjustable impedance elements, each having a first terminal coupled to a first terminal of one of the user ports and each having a second terminal coupled to a second terminal of the one of the user ports.

9. The apparatus of claim 1, further comprising:
third adjustable impedance elements, each being electrically connected to one of the antenna ports and another one of the user ports.

10. The apparatus of claim 1, wherein at least one of the third adjustable impedance elements is electrically connected to two of the antenna ports not to be adjacent.

11. The apparatus of claim 1, further comprising:
fourth adjustable impedance elements, each being electrically connected to one of the user ports and ground.

12. The apparatus of claim 1, wherein the number of n is identical to the number of m.

13. The apparatus of claim 1, wherein each of the second adjustable impedance elements is selected from a group consisting of an adjustable impedance device and a passive linear two-terminal circuit element.

14. The apparatus of claim 1, wherein each of the second adjustable impedance elements is a capacitor.

15. The apparatus of claim 1, wherein each of the third adjustable impedance elements is a capacitor.

* * * * *